(12) United States Patent
Tien

(10) Patent No.: US 6,477,696 B2
(45) Date of Patent: Nov. 5, 2002

(54) ROUTING DEFINITION TO OPTIMIZE LAYOUT DESIGN OF STANDARD CELLS

(75) Inventor: Li-Chun Tien, Hsinchu (TW)

(73) Assignee: Taiwan Semiconductor Manufacturing Corporation, Hsin-Chu (TW)

(*) Notice: Subject to any disclaimer, the term of this patent is extended or adjusted under 35 U.S.C. 154(b) by 8 days.

(21) Appl. No.: 09/832,430

(22) Filed: Apr. 10, 2001

(65) Prior Publication Data

US 2002/0007478 A1 Jan. 17, 2002

(30) Foreign Application Priority Data

Jul. 17, 2000 (TW) .......................... 89114284 A

(51) Int. Cl.⁷ .............................. G06F 17/50

(52) U.S. Cl. .......................... 716/17; 716/12

(58) Field of Search .............. 716/12, 14, 17

(56) References Cited

U.S. PATENT DOCUMENTS

| | | | | |
|---|---|---|---|---|
| 4,975,854 A | * | 12/1990 | Yabe | 364/491 |
| 6,321,371 B1 | * | 11/2001 | Yount, Jr. | 716/1 |
| 6,324,677 B1 | * | 11/2001 | Fisher et al. | 716/16 |
| 6,327,694 B1 | * | 12/2001 | Kanazawa | 716/8 |
| 6,378,121 B2 | * | 4/2002 | Hiraga | 716/13 |
| 6,385,761 B1 | * | 5/2002 | Bried | 716/8 |

* cited by examiner

*Primary Examiner*—Don Wong
*Assistant Examiner*—Minh Dieu A
(74) *Attorney, Agent, or Firm*—Blakely Sokoloff Taylor & Zafman LLP

(57) ABSTRACT

A novel routing rule definition for standard cells placement is disclosed. The method comprises following steps. At beginning, a statistical analysis is carried out to analyze the frequency of standard cells used in a design plane. The most frequency used types in standard cells is then used as bases for a greatest common divisor (GCD) calculation. The GCD value acquired is then as a routing pitch criterion, which is a distance of contact hole-to-contact hole, or says the standard cell width.

11 Claims, 2 Drawing Sheets

ROUTING DEFINITION TO OPTIMIZE LAYOUT DESIGN OF STANDARD CELLS

FIELD OF THE INVENTION

The present invention relations to a method of layout design of integrated circuit, specifically, to about doing a routing defined modification for standard cells, so as to make the layout optimization.

BACKGROUND OF THE Invention

In the semiconductor manufacturing process, the design of integrated circuit, especially, to application-specific integrated circuit (abbreviated as ASIC), generally, the steps are as follows: firstly, producing a netlist, and then system partitioning and prelayout simulation are successively followed. Next, a floorplanning to arrange the blocks of the netlist on the chip is performed . Thereafter, placing the standard cell in a block. Then perform routing to make connection between cells and blocks. Finally, extracting the resistance and capacitance of the connection, and postlayout simulation to check the design works are carried out. The standard cells includes logic gate, such as NAND, OR, NAND, NOR, AND, XOR and NOT or sequential device, flip-flop, latches, register and so on. After performing simulation for qualified approval, the manufacturing department is then implemented the physical processes in accordance with the layout design.

Generally, to place a standard cell, for example for an inverter, three via pitch distance is demanded. A width of two via pitches is not enough to accommodate such an inverter. A NAND gate with two inputs and one output requires about four via pitches. A NOR gate requires a space almost equivalent to a NAND gate. It is because the pitch width of connection line for standard cells is based on the definition of via-to-via between connection level according to the current design rule.

Please refer to FIG. 1, a schematic diagram shows a design of via-to-via about 0.15 μm feature length process. The metal via width w1 is 0.22 μm. The surround area to via hole with board width w2, w3 are about 0.05 μm and 0.01 μm, respectively. A space s1 between metal board is about 0.24 μm. And thus a pitch of via-to-via is about 0.56 μm. However, a width needed for a inverter is about 1.18 μm according to the design rule. Consequently, if an inverter is placed into a space of two via itches for saving the planar area of wafer. The poly-gate has to form by having about 45° turning angle so as to accommodate the spacing issue. Whereas, for deep sub-micron technology with device feature length of about 0.15 μm, 0.13 μm or beyond, the poly-gate with turning angle is not being allowed.

A similar problem is encountered for NAND gate layout. A two-inputs NAND gate, needs a width of about 1.77 μm. As a consequent, the routing rule according to prior art, of about four via pitches i.e., 2.24 μm is necessary to fit such a NAND gate. An extra planar area cost cannot be saved.

The layout for standard cells in accordance with the aforementioned prior art is failed to save some extra planar area. However, as is known skilled in the art, the NAND gate, NOR gate, and inverter together are occupied about 70 to 80% of the components for a typical logic circuit using basic standard cells. Thus, the better of the layout design will decide what a degree of the integrity of IC may be, or the chip size while the same amount of devices are placed.

An object of the invention is thus to provide a method which utilize the planar area of a chip fully.

SUMMARY OF THE INVENTION

An object of the present invention is to provide a novel routing definition so as to improve the non-compact layout issues.

The present invention is to provide a routing rule method. The method comprises following steps. At beginning, a statistical analysis is carried out to analyze the standard cells used times in a design plane. The most frequency used types in standard cells is then used as bases for a greatest common divisor (GCD) calculation. The GCD value acquired is then as a routing pitch criterion, which is a distance of contact hole-to-contact hole, or says the standard cell width.

According to the present invention the cross-point between the margins of standard cells along the cell height and the connection lines can be function as substrate contact to increase the cell reliability and

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

As forgoing design rule for standard cells according to prior art depicted is restricted, currently, by the design rule bases on the metal via pitch, which will result in wasting more planar areas of a chip. The present invention disclosed a method for routing pitch definition, which can solve aforementioned issue.

For very deep sub-micron design, the feature length of device of 0.15 μm, 0.13 μm or beyond, the inventor found that the core cells are almost abutment with the routing metal layers of five or six, or more. However, dominant factor to the chip size determine should be the size of the core cell but not the connection line pitch.

Figures 2, 3:
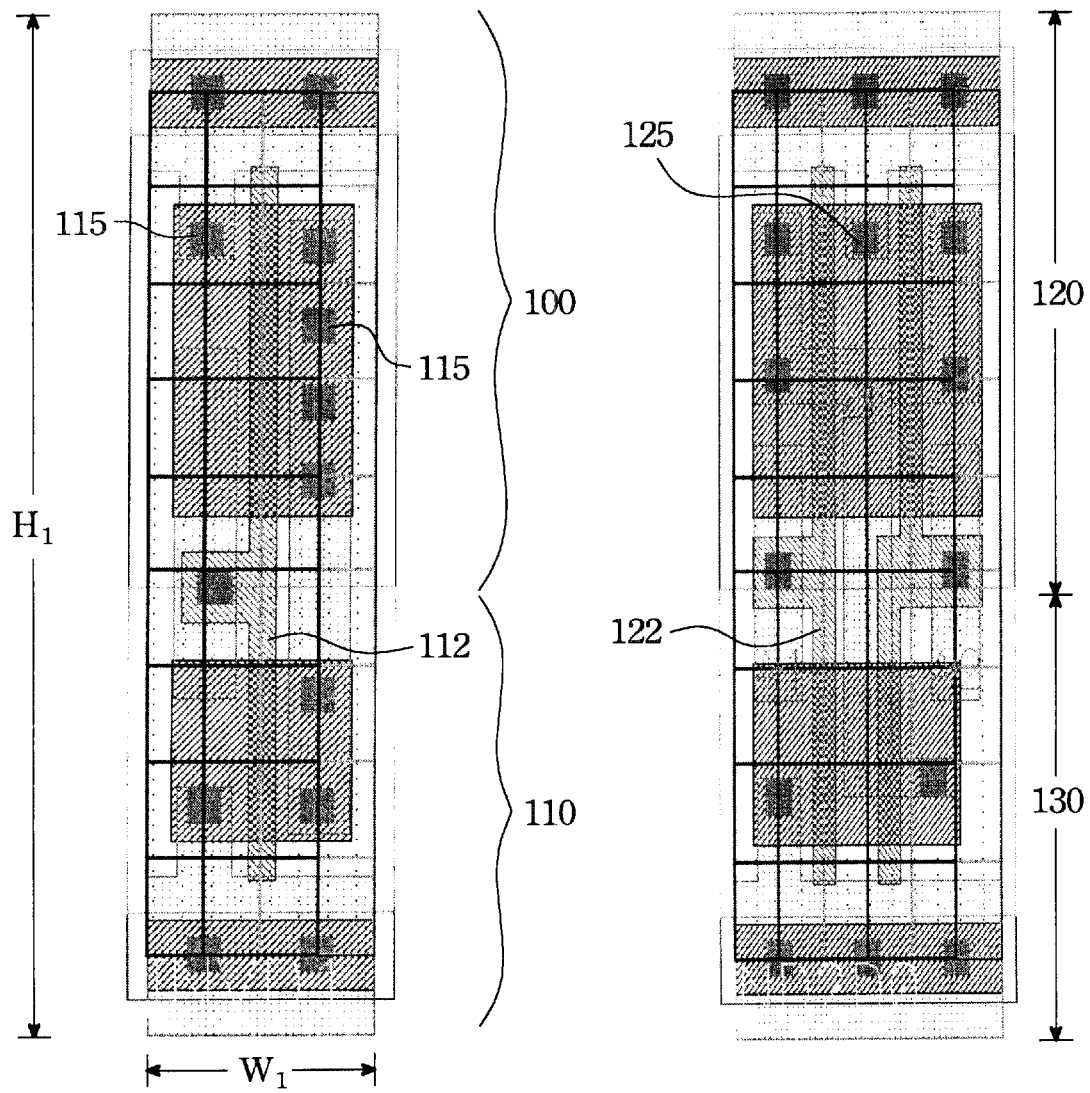
FIG. 2 shows a synoptic layout diagram of an inverter according to the present invention.
FIG. 3 shows a synoptic layout diagram of a NAND gate according to the present invention.

FIG. 2 shows an inverter gate is composed of a PMOS transistor 100 and a NMOS transistor 110 has a width W1 of about 1.18 μm and a cell high H1 of about 4.32 μm for 0.15 μm process technology. The width W1 is measured from a contact hole 115 through a polygate to another contact hole 115. For NAND gate and the same process technology, as shown in FIG. 3, includes two PMOS transistors 120 in parallel (contact holes in between two polygates 122) and two NMOS transistors 130 (without contact holes in between two polygates. The core cell size of a NAND gate is thus determined by the total size of two PMOS transistors. The size of a NAND gate is about 1.77 μm wider than the inverter. However, the height of NAND cell, however, is about 4.32 μm, the same as the inverter.

A NOR gate occupied area is of about the same as that of a NAND gate. The NOR gate has two PMOS transistors in series, and two NMOS transistors in parallel. The core cell size of a NOR gate is thus determined by the size of two NMOS transistors which have about 1.77 μm in width and 4.32 μm in height. As is in aforementioned prior art, the NOR gate and the NAND gate together with inverter gate are usually the most portion of the standard cells.

The more compact the layout to the NOR gate, the NAND gate and the inverter gate, as a consequent, will better the layout design. The inventor proposes thus a newly routing definition by using a greatest common divisor (GCD) of about 0.59 μm among them as a base unit. Using the GCD not only provides the close packed to the NOR, NAND and inverter, but also provides the D-flip-flop with most compact design, wherein a D-flip-flop is composed of NAND gates and NOR gates which is about 17 times the GCD in width, that is 0.59 μm×17=10.03 um.

Thus, using the contact-hole pitch as a routing criterion would be the most appropriate.

Figure 4:
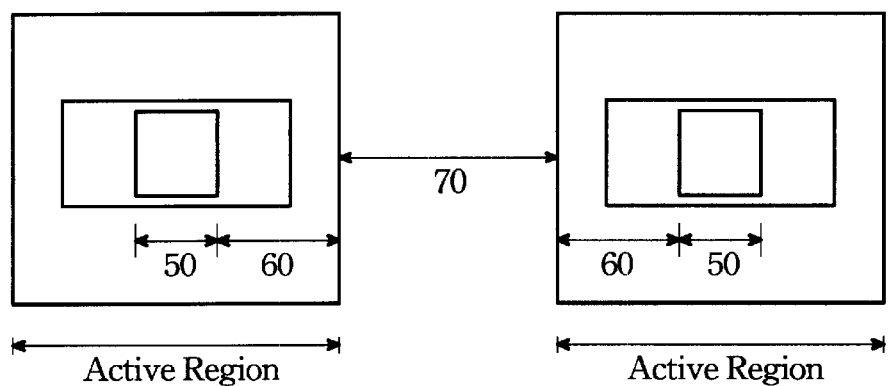
FIG. 4 shows a contact-hole pitch according to the present invention.

According to the preferred embodiment, the contact-hole pitch is 0.59 μm, as shown in FIG. 4, includes ½×contact hole width 50+a board width which enclosures the contact hole+spacing 70+another board width+½×contact hole width 50=½×0.18+0.085+0.24+0.085+½×0.18=0.59 (μm), The spacing 70 is a distance between active regions (please refer to FIG. 2 and FIG. 3.

Above data information is using a NAND gate of two-inputs and one out as an exemplification. The routing rule can be used in three-inputs, or four inputs NAND gate. For example, the former requires 4×0.59 μm spacing, and the latter requires 5×0.59 μm=2.95 μm.

The concept of the present invention can be summary as follows:

For an inverter of one input terminal, it requires two contact-hole pitches, and an NAND gate of three inputs, requires three contact-hole pitches. Similarly, for a NAND gate with three inputs, a width of four pitches is generally demanded.

Using the value of a GCD of the standard cells, in addition to compact the standard cells during layout, furthermore, the contact holes in the layout can be designed as a symmetry substrate contact array. Please see FIG. 5, the synoptic layout diagram, the substrate contacts are located at each cross point of connection line and a margin 147 of the standard cells along the cell height direction. Noted that in the figure, only the positions of standard cells instead of standard cells thereof are shown. The substrate contacts provide common contacts for the standard cells below and above thereof.

Figure 5:
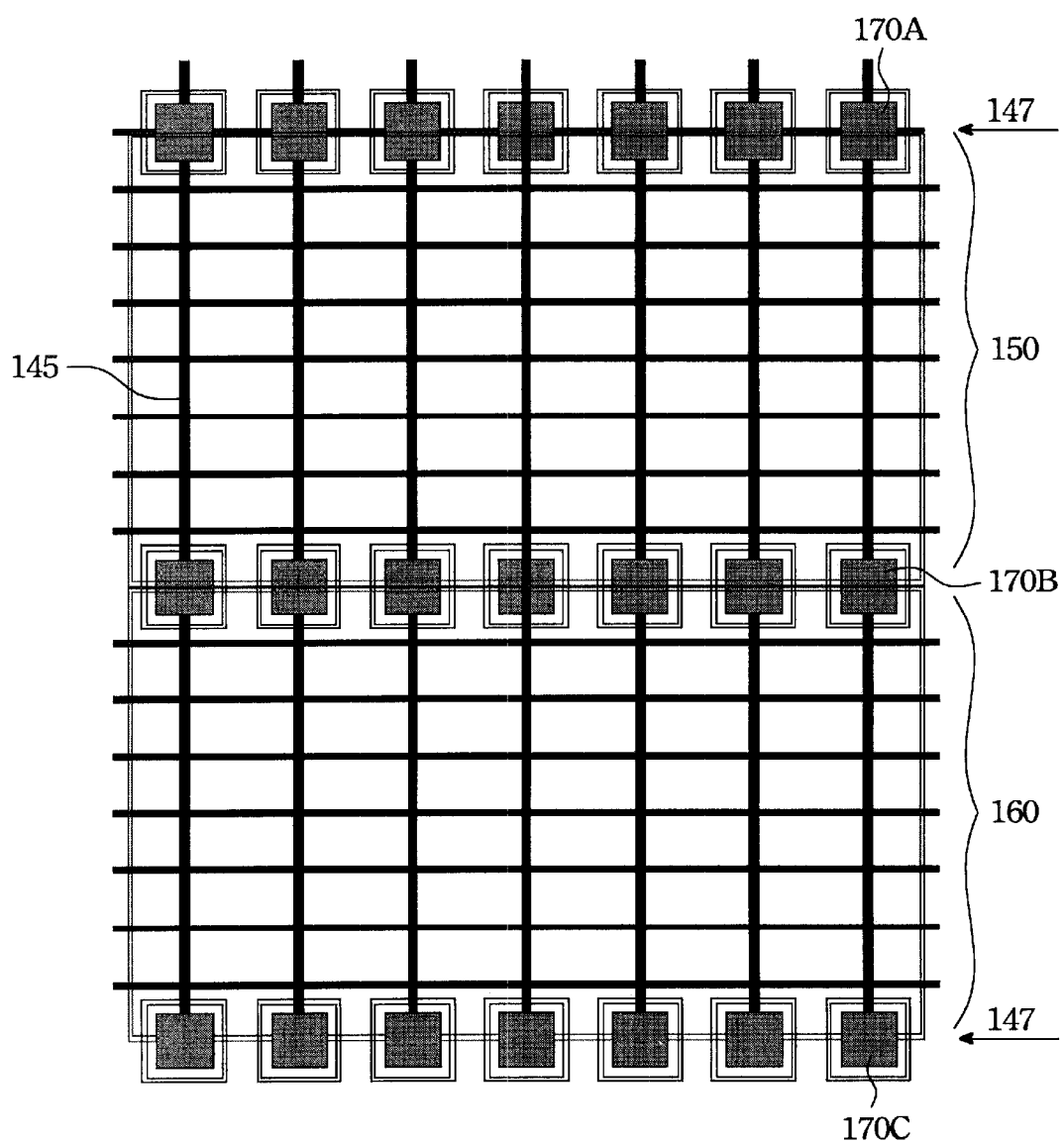
FIG. 5 shows a substrate contact array provides the standard cells below and above its position for common contact-hole use.

Still referring to FIG. 5, the substrate contacts provide the standard cells 150 (above substrate contact 170B) and the standard cells 160 (below substrate contact 170B) for common power connection terminal or common ground terminal use. The designer can then connect the substrate contacts depending on the routing requirement. Similarly, the substrate contacts 170A are provided for standard cells 150 and the standard cells above to use (not shown). The substrate contacts 170C are provided for standard cells 160 and the standard cells below (not shown) use. No extra area is required. The substrate contact concept thus saves the planar areas and increases the reliability.

The benefits of this invention are:

(1) The pitch of contact hole to contact hole as routing pitch unit can provide compact layout requirement.

(2) The routing pitch is based on the GCD of contact holes of the standard cells used. As a result, while altering the feature sizes of standard cells, it can thus very ease to modify the routing pitch according to the method of the present invention.

(3) Since the substrate contacts provided by both substrate cells about and below thereof, and thus the reliability is significantly increased.

As is understood by a person skilled in the art, the foregoing preferred embodiment of the present o invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A method for routing definition so as to optimize layout design comprising the steps of:

performing standard cells used times in a design plane statistical analysis so as to acquire types of said standard cells used frequency in top two, three or, four as selected types of said standard cells;

calculating a greatest common divisor (GCD) of said selected types of standard cells in cell width as a criterion of a routing definition; and using said GCD value as a contact pitch to performing routing and for said standard cell placement.

2. The method of claim 1, wherein said standard cells are logic gates or sequential gates selected from the group consisting of OR gate, NAND gate, NOR gate, AND, XOR, inverter, flip-flop, latches, and combination thereof.

3. The method of claim 1, wherein said widths of said selected types standard cells are widths each measured from two nearest contact holes across a polygate in between for an inverter or polygates in between for said standard cells with parallel polygates.

4. The method of claim 1, further comprising setting substrate contacts at each cross point of said contact pitch and a margin along cell height direction of said standard cells.

5. A method for routing definition so as to optimize layout design comprising the steps of:

determining a greatest common divisor (GCD) of cell widths of an inverter and an NAND gate; and using said GCD as a contact hole pitch for routing bases.

6. The method of claim 5, wherein said NAND gate comprising at least one selecting from two inputs-one output NAND gate, or three inputs-one output NAND gate, or four input-one output NAND gate.

7. The method of claim 5, wherein a cell width of said inverter is a width measured from two nearest contact holes across a polygate in between.

8. The method of claim 5, wherein a cell width of said NAND is a width measured from two nearest contact holes across parallel polygates in between.

9. The method of claim 5, further comprising setting substrate contacts at each cross point of said pitch and a margin of a standard cell along a cell height direction.

10. A method for routing definition so as to optimize layout design comprising the steps of:

determining a pitch of two nearest contact holes across a polygate in between; and using said pitch as a basis of routing.

11. The method of claim 10, further comprising setting substrate contacts at each cross point of said pitch and an margin of said standard cells along a direction of cell height, said substrate contacts providing contacts for standard cells where standard cells lie below and above said substrate contact.

* * * * *

UNITED STATES PATENT AND TRADEMARK OFFICE
CERTIFICATE OF CORRECTION

PATENT NO. : 6,477,696 B2
DATED : November 5, 2002
INVENTOR(S) : Tien

It is certified that error appears in the above-identified patent and that said Letters Patent is hereby corrected as shown below:

Title page,
Item [54], Title, before "ROUTING" please insert -- NEW --.

Figure 1:
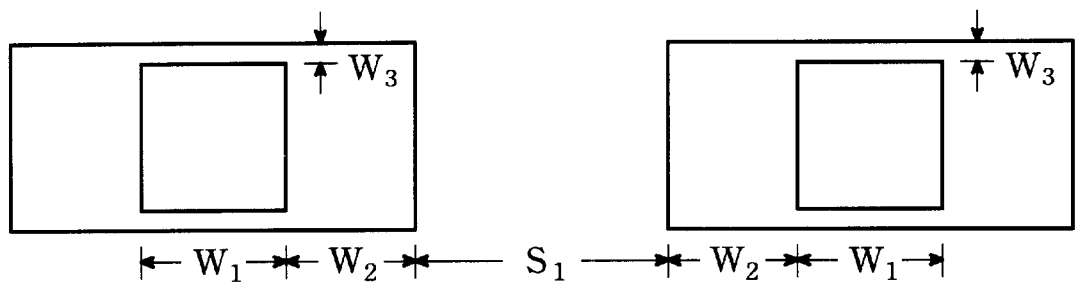
FIG. 1 shows a conventional routing pitch according via to via.

Drawings,
Figure 1, please delete "FIG. 1" and insert -- FIG. 1 (PRIOR ART) --.

Signed and Sealed this

Twenty-second Day of June, 2004

JON W. DUDAS
*Acting Director of the United States Patent and Trademark Office*